United States Patent
Mirkin et al.

(10) Patent No.: US 7,776,130 B2
(45) Date of Patent: Aug. 17, 2010

(54) PH-CONTROLLED PHOTOSYNTHESIS OF SILVER NANOPRISMS

(75) Inventors: Chad A. Mirkin, Wilmette, IL (US); Can Xue, Evanston, IL (US)

(73) Assignee: Northwestern University, Evanston, IL (US)

( * ) Notice: Subject to any disclaimer, the term of this patent is extended or adjusted under 35 U.S.C. 154(b) by 446 days.

(21) Appl. No.: 11/820,087

(22) Filed: Jun. 18, 2007

(65) Prior Publication Data

US 2008/0029382 A1 Feb. 7, 2008

Related U.S. Application Data

(60) Provisional application No. 60/814,831, filed on Jun. 19, 2006.

(51) Int. Cl.
B22F 9/24 (2006.01)
(52) U.S. Cl. .......................................... 75/345; 75/370
(58) Field of Classification Search ........................ None
See application file for complete search history.

(56) References Cited

U.S. PATENT DOCUMENTS 7,135,054 B2 * 11/2006 Jin et al. ........................ 75/255
7,252,698 B2 * 8/2007 Mirkin et al. ................. 75/255

OTHER PUBLICATIONS

Callegari et al., "Photochemically grown silver nanoparticles with wavelength-controlled size and shape", Nano Letters, 3(11):1565-1568 (2003).
Xue et al., "pH-switchable silver nanoprism growth pathways", Angew. Chem. Int. Ed., 46:2036-2038 (2007).
International Search Report for PCT/US2007/014186 dated Dec. 17, 2007.
Written Opinion for PCT/US2007/014186 dated Dec. 17, 2007.
Ahmadi et al., "Shape-controlled synthesis of colloidal platinum nanoparticles," Science, 272:1924-1926 (1996).
Barnes et al., "Surface plasmon subwavelength optics," Nature, 424:824-830 (2003).
Cerruti et al., "Gold and silica-coated gold nanoparticles as thermographic labels for DNA detection," Anal. Chem., 78:3282-3288 (2006).
Elghanian et al., "Selective colorimetric detection of polynucleotides based on the distance-dependent optical properties of gold nanoparticles," Science, 277:1078-1081 (1997).
Eustis et al., "Why gold nanoparticles are more precious than pretty gold: noble metal surface plasmon resonance and its enhancement of the radiative and nonradiative properties of nanocrystals of different shapes," Chem. Soc. Rev., 35:209-217 (2006).
Jin et al., "Controlling anisotropic nanoparticle growth through plasmon excitation," Nature, 425:487-490 (2003).
Jin et al., "Photoinduced conversion of silver nanospheres to nanoprisms," Science, 294:1901-1903 (2001).
Kim et al., "Photochemical synthesis of gold nanorods," J. Am. Chem. Soc., 124:14316-14317 (2002).
Kim et al., "Platonic gold nanocrystals," Angew. Chem. Int. Ed. Engl., 43:3673-3677 (2004).
Metraux et al., "Rapid thermal synthesis of silver nanoprisms with chemically tailorable thickness," Adv. Mat., 17: 412-415 (2005).
Millstone et al., "Controlling the edge length of gold nanoprisms via a seed-mediated approach," Adv. Functional Mat., 6: 1209-1214 (2006).
Mulvaney et al., "Glass-coated, analyte-tagged nanoparticles: a new tagging system based on detection with surface-enhanced raman scattering," Langmuir, 19:4784-4790 (2003).
Murphy et al., "Anisotropic metal nanoparticles: synthesis, assembly, and optical applications," J. Phys. Chem. B., 109:13857-13870 (2005).
Narayanan et al., "Catalysis with transition metal nanoparticles in colloidal solution: nanoparticle shape dependence and stability," J. Phys. Chem. B, 109:12663-12676 (2005).
Orendorff et al., "Shape-dependent plasmon-resonant gold nanoparticles," Small, 2:636-639 (2006).
Radloff et al., "Metal nanoshell assembly on a virus bioscaffold," Nano Lett., 5:1187-1191 (2005).
Sun et al., "Shape-controlled synthesis of gold and silver nanoparticles," Science, 298:2176-2179 (2002).
Xiong et al., "Corrosion-based synthesis of single-crystal Pd nanoboxes and nanocages and their surface plasmon properties," Angew. Chem. Int. Ed. Engl., 44:7913-7917 (2005).

* cited by examiner

*Primary Examiner*—George Wyszomierski
(74) *Attorney, Agent, or Firm*—Marshall, Gerstein & Borun LLP

(57) ABSTRACT

Silver nanoprisms having a unimodal size distribution are disclosed. The size of the nanoprisms can be controlled by adjusting the pH during irradiation of silver nanocrystals.

15 Claims, 3 Drawing Sheets

US 7,776,130 B2

PH-CONTROLLED PHOTOSYNTHESIS OF SILVER NANOPRISMS

CROSS-REFERENCE TO RELATED APPLICATIONS

This application claims the benefit of U.S. Provisional Application Ser. No. 60/814,831, filed Jun. 19, 2006, which is incorporated herein in its entirety by reference.

STATEMENT OF GOVERNMENT INTEREST

This invention was made with U.S. government support under Department of Naval Research grant no. N00014-06-1-0079; National Science Foundation grant no. EEC-0118025; and the National Science Foundation/Materials Research Science Engineering Centers grant no. DMR-0076097. The government has certain rights in this invention.

FIELD OF THE INVENTION

The present invention is directed to triangular silver nanoprisms having a unimodal size distribution and methods of preparing these silver nanoprisms.

BACKGROUND

Major strides have been made in the development of methods for synthesizing and controlling the shapes of metallic nanocrystals. Such particles have been used in optics (Barnes, et al., *Nature* 424: 824-830 (2003); Eustis, et al. *Chem. Soc. Rev.* 217: 209-217 (2006)) catalysts (Narayanan, et al. *J. Phys. Chem. B* 109: 12663-12676 (2005)), and biological diagnostics (Mulvaney, et al. *Langmuir* 19: 4784-4790 (2003); Cerruti, et al. *Anal. Chem.* 78: 3282-3288 (2006); Elghanian, et al. *Science* 277: 1078-1081 (1997)). Nanocrystal size and shape are extremely important parameters because they substantially affect the physical and chemical properties of the nanocrystals. Toward this end, a variety of new non-spherical nanostructures have been made including rods (Orendorff, et al. *Small* 2: 636-639 (2002); Murphy, et al. *J. Phys. Chem B* 109: 13857-13870 (2005); Kim, et al. *J. Am. Chem. Soc.* 124: 14316-14317 (2002)), boxes (Xiong, et al. *Angew. Chem. Int. Ed.* 44:7913-7917 (2005)), shells (Radloff, et al. *Nano Lett.* 4:1323-1327 (2004)), tetrahedra (Almadi, et al. *Science* 272:1924-1926 (1996)), cubes (Sun, et al. *Science* 298:2176-2179 (2002); Kim, et al. *Angew. Chem. Int. Ed.* 43: 3673-3677 (2004)), and prisms (Jin, et al. *Science* 294:1901-1903 (2001); Jin, et al. *Nature* 425:487-490 (2003); Metraux, et al. *Adv. Mater.* 17:12-415 (2005); Millstone, et al. *Adv. Funct. Mater.* 6:1209-1214 (2006)). Each of these structures exhibit unique plasmonic properties that depend upon their size and shape.

Silver is particularly interesting because silver triangular nanoprisms can be prepared by either a thermal or a photochemical method. The current photoreaction used to generate silver nanoprisms provides prismatic nanocrystals by irradiating a mixture of spherical nanoparticles, which have a relatively polydisperse size distribution, at two wavelengths: one that suppresses prism fusion and one that facilitates slow growth of the prism until the prism no longer absorbs this wavelength light. If only single wavelength of light is used these two processes, prism fusion and prism growth, generate a bimodal distribution of silver nanoprisms. The larger prisms have an edge length that is about twice the edge length of the smaller prisms. While the prism fusion process is interesting, it synthetically limits the preparation of monodisperse samples of one prism size. Thus, a need exists for processes which allow for monodisperse prism formation of both small (Type I) silver nanoprisms and large (Type II) silver nanoprisms.

SUMMARY

Disclosed herein are processes of preparing triangular silver nanoprisms having a unimodal size distribution. The process comprises controlling nanoprism size and size distribution by controlling pH of the reacting admixture. The disclosed invention has an advantage over previous existing methods because this method produces a unimodal distribution of nanoprisms, thereby eliminating the need for costly and timely purification of nanoprisms of disparate sizes.

Thus, one aspect provides a process for the production of monodisperse triangular Type I silver nanoprisms comprising irradiating a mixture of silver nanocrystals at a pH of about 10 to about 12 to form triangular Type I silver nanoprisms having a unimodal size distribution. In some embodiments, the silver nanocrystals are formed in situ by admixing a silver salt and a reducing agent under conditions sufficient to form the silver nanocrystals. In various cases, the silver salt can be silver nitrate, silver acetate, silver perchlorate, silver sulfate, or a mixture thereof.

Another aspect provides a process for the production of monodisperse triangular Type II silver nanoprisms comprising irradiating a mixture of silver nanocrystals at a pH of about 6 to about 8 to form triangular Type II silver nanoprisms having a unimodal size distribution. In some embodiments, the silver nanocrystals are formed in situ by admixing a silver salt and a reducing agent under conditions sufficient to form the silver nanocrystals. In various cases, the silver salt can be silver nitrate, silver acetate, silver perchlorate, silver sulfate, or a mixture thereof.

DETAILED DESCRIPTION OF THE PREFERRED EMBODIMENTS

Disclosed herein is a method for the synthesis of triangular silver nanoprisms with uniform size employing a single wavelength of light. Unimodal silver nanoprisms are provided by adjusting the pH of a solution of silver nanoparticles. Without wishing to be bound by theory, it is hypothesized that by controlling the solution pH or the overall surface charge on each particle the nanoprism fusion process is controlled. Functionally, by adjusting the pH and wavelength of light, the fusion process which controls the final size of the silver nanoprism can be suppressed or promoted. This suppression or promotion can be used to provide nanoprisms having a unimodal size distribution and to simply their synthesis, eliminating the need for secondary irradiation, which is typically used to suppress cluster fusion. The resulting silver nanoprisms can be prepared with excellent size control and typically exhibit narrow plasmon bands in the visible and near infrared (NIR) spectral window.

Figure 1A:
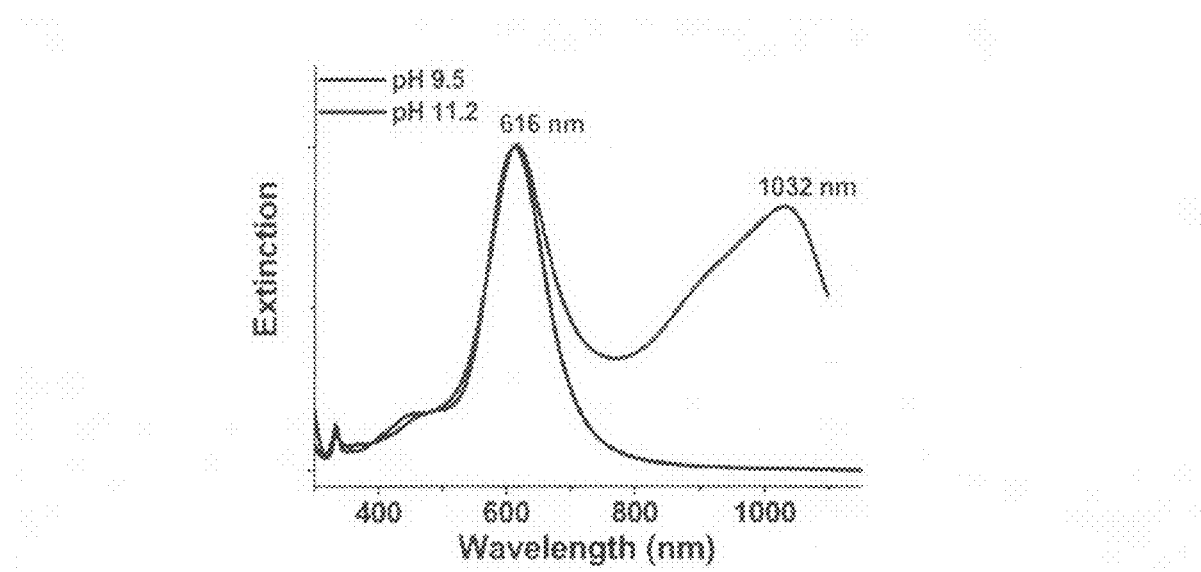
FIG. 1. (a) The optical spectrum of silver nanoprism solutions depicting the optical spectrum of the product from the irradiation of silver nanocrystals at about 550 nm at an unaugmented pH showing two absorption peaks, at about 600 nm and at about 1100 nm, indicative of a mixture of Type I and Type II silver nanoprisms. The figure also depicts the optical spectrum of the product from the irradiation of silver nanocrystals at about 500 nm at a pH of about 11.2 showing a single adsorption at about 600 nm indicative of pure Type I silver nanoprisms. (b) The TEM image of the product from the irradiation of silver nanocrystals at a pH of about 11.2 showing the unimodal size distribution of the Type I silver nanoprisms. The scale bar is 100 nm.
Figure 1B:
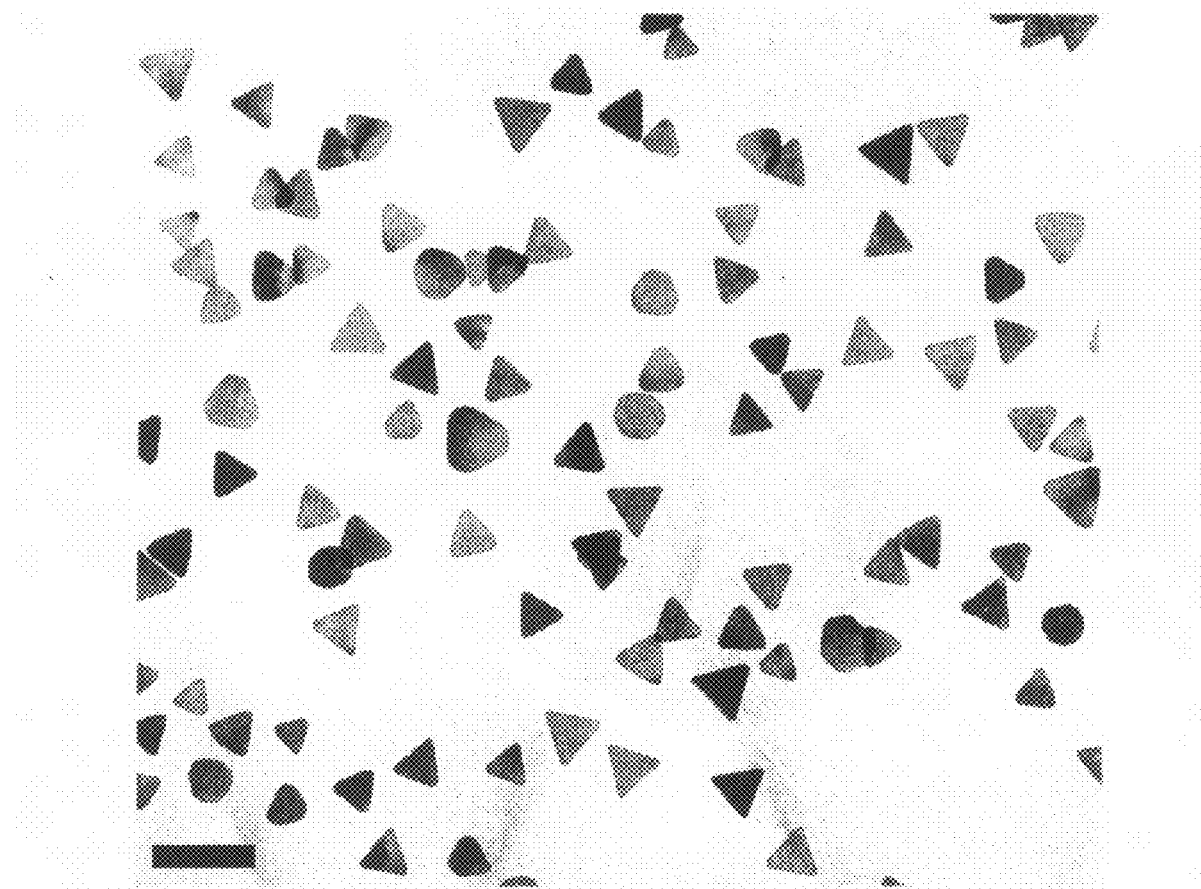
Figure 2A:
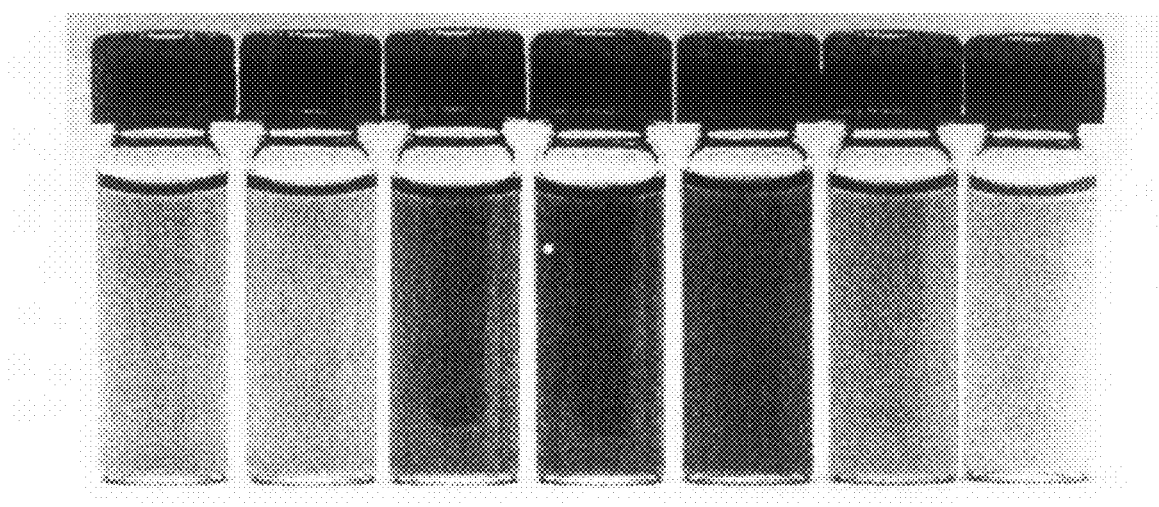
FIG. 2. (a) Photographs of solutions of Type I silver nanoprisms depicting the difference in color between silver nanoprisms dependant on the wavelength of light used in the irradiation of silver nanocrystals at a pH of about 11.2. From left to right, silver nanoprisms were formed by irradiation with light having a wavelength of about 470, 488, 500, 514, 550, 600 and 633 nm. (b) The optical spectra of solutions of Type I silver nanoprisms depicting the different adsorption maximum between silver nanoprisms dependant on the wavelength of light used in the irradiation of silver nanocrystals at a pH of about 11.2. The adsorption is at lower energy when the silver nanoprism is formed with longer wavelengths of light. The highest energy adsorption maximum corresponds to silver nanoprism formed by irradiation of silver nanoprisms with light at about 470 nm. From left to right, silver nanoprisms adsorption peaks correspond to nanoprisms formed by irradiation with light at about 470, 488, 500, 514, 550, 600 and 633 nm.
Figure 2B:
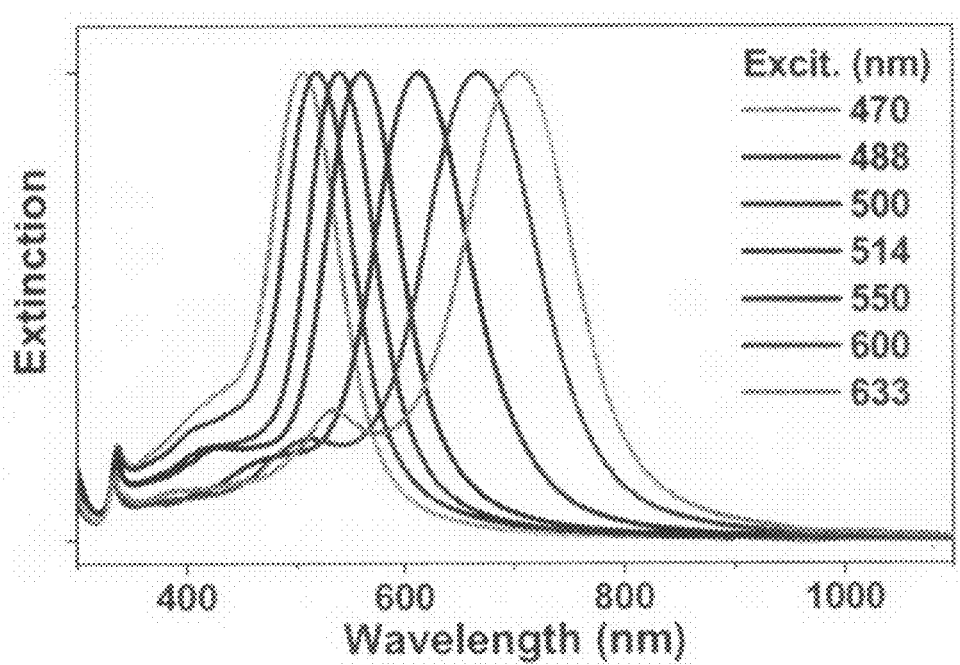

The nanoprisms formed in this invention are made of silver and are triangular plates, as illustrated in FIGS. 1B and 2B. The prisms appear as roughly equilateral triangles with a triangle edge length which is longer than the thickness of the nanoprism.

The silver nanoprisms prepared by the disclosed methods have a unimodal size distribution. The term "unimodal size distribution," as used herein, refers to nanoprisms having is a distribution of particle sizes that is centered about a single particle size, measured by the edge length along the triangular face of the nanoprism. Typically, a nanoprism's edge length, or "size," is reported as a single measurement, which is the mean of the silver nanoprisms' edge length. Thus, a silver nanoprism reported to have a size of about 30 nm will typically have a range of edge lengths of about 20 nm to about 40 nm. In general, the edge length of silver nanoprisms can vary up to about 35% of the mean.

Silver nanoprism are generally formed in two distinct size ranges, Type I nanoprisms and Type II nanoprisms, easily identifiable by their different optical absorptions which is illustrated in FIG. 1A. Type I nanoprisms have an triangular edge length of about 30 nm to about 80 nm and exhibit a plasmon resonance of about 500 nm to about 800 nm. Type II nanoprisms typically have a triangular edge length about twice that of the Type I nanoprisms. Type I nanoprisms are about 100 nm to about 300 nm, and exhibit a plasmon resonance at about 900 nm to about 1500 nm. Typically, Type II nanoprisms result from the fusion (usually edge length fusion) of two Type I nanoprisms.

Nanoprisms can be formed by exposing a suspension of silver nanocrystals to light having a wavelength less then about 750 nm. The reaction that transforms the nanocrystals to nanoprisms is controlled by the exposure to light. Exposure to light in the range of about 450 to 750 nm is preferred. The reaction is not initiated in the dark or by exposure to light greater than about 750 nm. The starting suspension is stable as silver nanocrystals for at least two months when protected from light.

The nanoprisms are formed by irradiating the nanocrystals with light having a suitable wavelength. Typically, the wavelength is about 450 nm to about 700 nm. In some embodiments, the wavelength is about 470±5 nm, about 488±5 nm, 500±5 nm, 514±5 nm, 550±20 nm, 600±20 nm, or 633±20 nm.

The nanocrystals are converted to nanoprisms by irradiation at specific pH ranges. These pH ranges are obtained by adding acid, base, or buffer to the silver suspension prior to irradiation. In some cases, base is added prior to irradiation. Nonlimiting examples of base are alkali metal hydroxides, alkali earth metal hydroxides, alkali metal salts, combinations thereof, or other reagents that effect the surface charge on the silver nanoparticles and nanoprisms. Preferably, sodium hydroxide is added in sufficient quantity to raise the pH of the silver nanoparticle solution to about 10 to about 12. In other cases, acid is added prior to irradiation. Preferably, acid is added in sufficient quantities to lower the pH to about 6 to about 8. A nonlimiting example of acid is nitric acid.

The pH of the nanocrystals during irradiation influences the type of nanoprism that is formed. A pH of about 10 to about 12 results in formation of Type I nanoprisms. A lower pH of about 6 up to 8 results in formation of Type II nanoprisms. In some cases the pH during irradiation is about 10 to about 11.5, or about 10.5 to about 11.5, to form Type I nanoprisms, or about 6 to about 7.9, or about 7 to about 7.5, to form Type II nanoprisms.

As used herein, the term "nanocrystals" and "nanoparticles" are synonymous and refer to small particles of silver that are not prismatic or exhibit the plasmon resonances of a nanoprism. The nanocrystals can be used to form nanoprisms upon exposure to light.

In some cases, the methods disclosed herein further comprise forming the silver nanocrystals prior to irradiating. In some cases, the silver nanocrystals are formed in situ. The silver nanocrystals can be formed from any silver salt capable of dissolution in the selected suspension medium. For example, silver nitrate, silver acetate, silver perchlorate, or silver sulfate perform comparably as a silver source.

In some cases, the silver salt is in an aqueous solution, but the salt can be dissolved in any solvent compatible with the conditions to form nanocrystals. Preferably, the silver salt has a concentration of about 0.1 mM Ag, but can be about 0.05 mM, about 0.06 mM, about 0.07 mM, about 0.08 mM, or about 0.09 mM Ag. In some cases, the concentration of silver is about 0.11 mM, about 0.12 mM, about 0.13 mM, about 0.14 mM, about 0.15 mM, about 0.2 mM, or about 0.25 mM.

A reducing agent is added to the silver salt to promote nanocrystal formation. Typically, the reducing agent is sodium borohydride, but can be any reducing agent that is compatible with the conditions to form nanocrystals. Nonlimiting examples include sodium triacetoxy borohydride, diisobutylaluminum hydride, lithium aluminum hydride, potassium tri-sec-butylborohydride, potassium triethylborohydride, sodium tri-sec-butylborohydride, lithium triethylborohydride, lithium tri-sec-butylborohydride, methyl oxazaborolidine, diisopinocampheylchloroborane, methoxydiethylborane, dibutylboron triflate, dicyclohexylboron triflate, dicyclohexylchloroborane, borane-tetrahydrofuran complex, dimethylsulfide borane, diethylaniline borane, tert-butylamine borane, morpholine borane, dimethylamine borane, triethylamine borane, pyridine borane, and mixtures thereof.

In some cases, separation agents are added to the mixture of the silver salt and reducing agent. As used herein, "separation agent" refers to an additive capable of preventing nanocrystal and/or nanoprism agglomeration. More than one separation agent can be added to the admixture. In some embodiments, the separation agent comprises bis(p-sulphonatophenyl)phenylphosphine dehydrate dipotassium (BSPP) and/or citric acid or a salt thereof. Preferable concentrations for BSPP are from 0 to about 5 mM. Preferably, an alkali metal citrate, for example trisodium citrate, is used in a concentration of about 0.1 mM to about 1.5 mM. Additional and nonlimiting examples of ligands include polyvinylpyrrolidine, sodium poly(acetate), polyethyleneimine, ethylenediaminetetraacetate salts, and related polyamino carboxylic acid salts, diethylenetriaminepentaacetic acid, N-hydroxyethylethylenediaminetriaacetic acid, nitrilotriacetic acid, and mixtures thereof.

In particular, FIG. 1A illustrates the effect of adding base to a solution of silver salt, reducing agent, and separation agent prior to irradiation with light having a wavelength of about 550 nm. In the reaction with an uncorrected pH, Type I and Type II silver nanoprisms are formed as seen by the adsorptions at about 600 nm (Type I) and 1100 nm (Type II). When the pH was raised by the addition of base to pH 11.2, only Type I nanoprisms were formed as seen by the single adsorption at about 600 nm. The effect of the raised pH on the distribution of nanoprism size is seen in FIG. 1B.

Figure 3A:
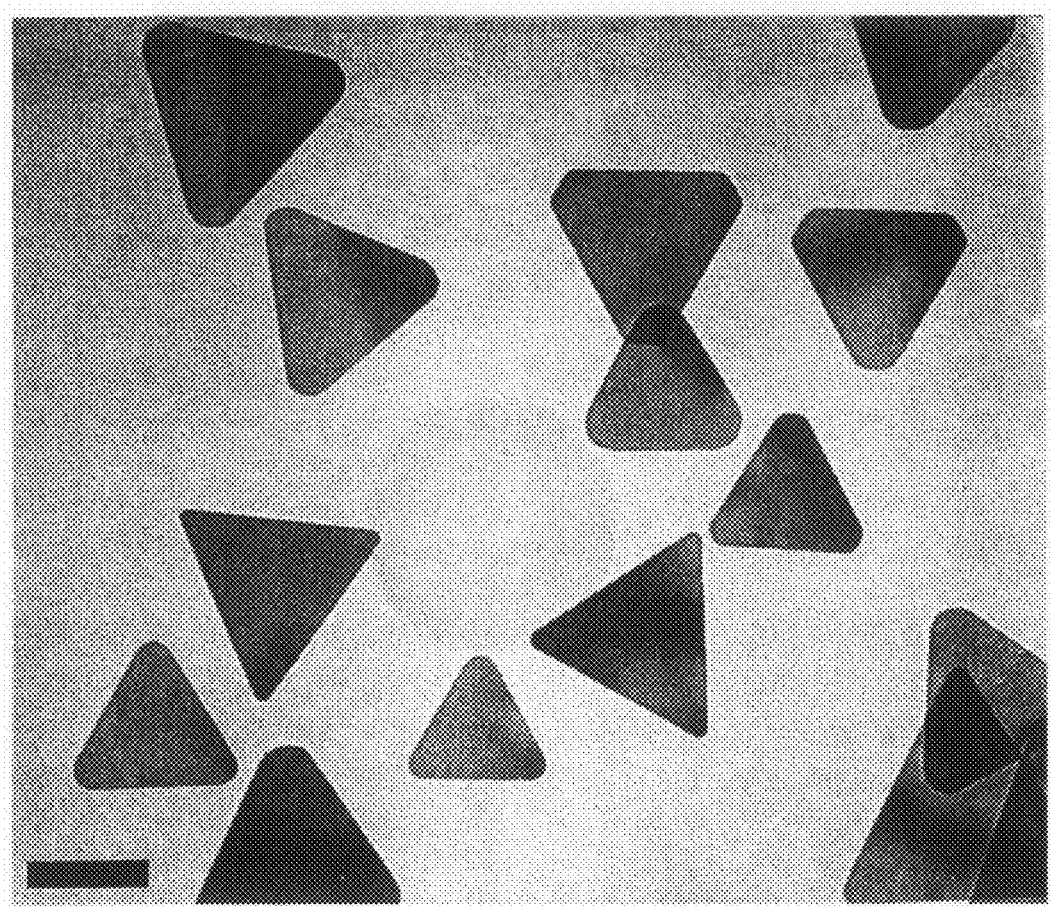
FIG. 3. (a) The TEM image of the product from the irradiation of silver nanocrystals at a pH of about 7.4 showing the unimodal size distribution of the Type II silver nanoprisms. The scale bar is 100 nm. (b) The optical spectra of solutions of Type II silver nanoprisms depicting the different adsorption maximum between silver nanoprisms dependant on the wavelength of light used in the irradiation of silver nanocrystals at a pH of about 7.4. The adsorption is at lower energy when the silver nanoprism is formed with longer wavelengths of light. The highest energy adsorption maximum corresponds to silver nanoprism formed by irradiation of silver nanoprisms with light at about 500 nm. From left to right, silver nanoprisms adsorption peaks correspond to nanoprisms formed by irradiation with light having a wavelength of about 500, 550, and 600 nm.
Figure 3B:
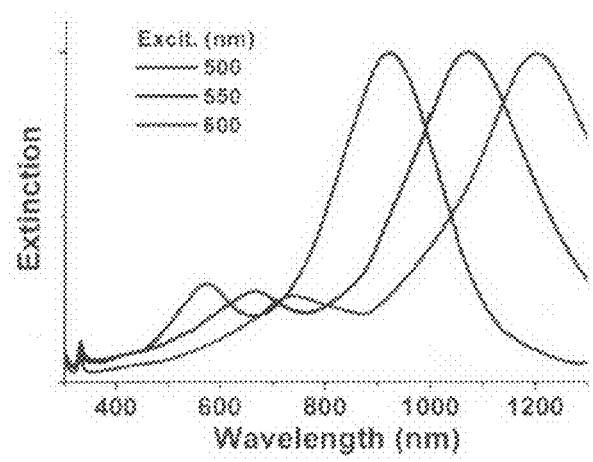

The variation of the wavelength at which the solution is irradiated controls the size of the nanoprisms within their Type class (Type I or Type II). FIG. 2 shows the effects of different wavelengths on the adsorption characteristics of the nanoprisms. The adsorption characteristics are indicative of the distribution of sizes (unimodal vs. bimodal) and the average physical size of the nanoprisms. The progressive shift of the adsorption peak in FIG. 2B to lower energy corresponds with the nanoprisms of progressively larger sizes. The effect of Type I nanoprisms of progressively larger sizes is visually apparent in FIG. 2A. The same effect is seen in the synthesis of Type II nanoprisms. FIG. 3B shows the progressive shift to lower energy indicative of larger particle sizes when the formation of the nanoprism was conducted at low pH and the wavelength of irradiation was varied. FIG. 3A shows the physical distribution of the Type II nanoprisms that were made at a pH of about 7.5 and with light at about 550 nm.

The optical properties of these novel nanostructures are striking, and these nanoprisms provide the first observation of two distinct quadrupole plasmon resonances for a nanoparticle. Additionally, unlike the spherical particles from which they are derived, and which scatter light in the blue, the nanoprisms of the present invention exhibit Rayleigh scattering in the red. Light scattering of metal nanoparticles probes has already been exploited in the development of many biodiagnostic applications and although conventional spherical particles made of gold or silver do not scatter in the red, their scattering properties can be tailored by adjusting their size and composition as shown in FIG. 2A. Therefore, these novel nanoprisms and their unusual optical properties permit development of multicolor labels based on nanoparticle composition, size and shape.

The nanoparticles can be used as new diagnostic labels, lighting up when target DNA is present. Biodetectors incorporating nanoprisms can be used to quickly, easily and accurately detect biological molecules as well as a wide range of genetic and pathogenic diseases, from genetic markers for cancer and neurodegenerative diseases to HIV and sexually transmitted diseases.

EXAMPLES

The present invention is further explained by the following examples which should not be construed by way of limiting the scope of the present invention.

Example 1

Silver nitrate, sodium borohydride, sodium citrate, and BSPP were dissolved in water. The pH of the solution was then adjusted to about 11.2 by the addition of sodium hydroxide. The mixture was then irradiated at 550 nm. The resulting unimodal distribution of silver nanoprisms had an average size of about 60 nm, as shown in FIG. 1B. The extinction spectrum of these nanoprisms is markedly different from that of nanoprisms prepared under similar conditions but at a pH of about 9.5. The nanoprisms formed at a pH of about 9.5 show a two distinct absorptions, indicating a bimodal size distribution, while the nanoprisms formed at a pH of about 11.2 show a single absorption, indicated a unimodal size distribution. The corresponding TEM image confirms the unimodal size distribution of the resulting nanoprisms prepared at pH 11.2.

Example 2

Silver nitrate, sodium borohydride, sodium citrate, and BSPP were dissolved in water. The pH of the solution was then adjusted to about 11.2 by the addition of sodium hydroxide. The mixture was then irradiated at 470±5 nm, 488±5 nm, 500±5 nm, 514±5 nm, 550±20 nm, 600±20 nm, or 633±20 nm. The resulting nanoprisms exhibited different excitation spectra, as indicated in FIG. 2B, which corresponded to different colors in solution, as seen in FIG. 2A.

Example 3

Silver nitrate, sodium borohydride, sodium citrate, and BSPP were dissolved in water. The pH of the solution was then adjusted to about 7.4 by the addition of nitric acid. The mixture was then irradiated at 500±20 nm, 550±20 nm; or 600±20 nm. The resulting unimodal distribution of silver nanoprisms had an average size of about 130 nm, as shown in FIG. 3A, and extinction spectra as indicated in FIG. 3B.

What is claimed:

1. A process for the production of monodisperse triangular Type II silver nanoprisms comprising:
   irradiating a mixture comprising silver nanocrystals with light having a first narrow band of wavelengths to form triangular Type I silver nanoprisms having unimodal size distribution, the mixture having a pH of about 10 to about 12; and
   irradiating a solution comprising the triangular Type I silver nanoprisms with light having a second narrow band of wavelengths to form triangular Type II silver nanoprisms having a unimodal size distribution and at least one edge length of about 100 nm to about 500 nm, the solution having a pH of about 6 to up to 8.

2. The process of claim 1, wherein the silver nanocrystals are formed in situ by admixing a silver salt and a reducing agent under conditions sufficient to form the silver nanocrystals.

3. The process of claim 2, wherein the silver salt is selected from the group consisting of silver nitrate, silver acetate, silver perchlorate, silver sulfate, and mixtures thereof.

4. The process of claim 2, wherein the reducing agent is selected from the group consisting of sodium borohydride, sodium triacetoxy borohydride, diisobutylaluminum hydride, potassium tri-sec-butylborohydride, potassium triethylborohydride, sodium tri-sec-butylborohydride, lithium triethylborohydride, lithium tri-sec-butylborohydride, methyl oxazaborolidine, diisopinocampheylchloroborane, methoxydiethylborane, dibutylboron triflate, dicyclohexylboron triflate, dicyclohexylchloroborane, borane-tetrahydrofuran complex, dimethylsulfide borane, diethylaniline borane, tert-butylamine borane, morpholine borane, dimethylamine borane, triethylamine borane, pyridine borane, and mixtures thereof.

5. The process of claim 2, wherein the silver salt comprises silver nitrate and the reducing agent comprises sodium borohydride.

6. The process of claim 2, wherein the admixture to form silver nanocrystals in situ further comprises at least one separation agent.

7. The process of claim 6, wherein the at least one separation agent comprises bis(p-sulfonatophenyl)phenylphosphine, citric acid or a salt thereof, or mixtures thereof.

8. The process of claim 1, wherein the first or second narrow band of wavelengths is selected from the group consisting of about 470±5 nm, about 488±5 nm, about 500±5 nm, about 514±5 nm, about 550±20 nm, about 600±20 nm, and about 633±20 nm.

9. The process of claim 1, wherein the pH of the mixture is about 10 to about 11.5.

10. The process of claim 9, wherein the pH of the mixture is about 10.5 to about 11.5.

11. The process of claim 1, wherein at least one edge length of the triangular Type I silver nanoprisms is about 30 nm to about 80 nm.

12. The process of claim 11, wherein at least one edge length of the Type I silver nanoprisms is about 50 nm to about 70 nm.

13. The process of claim 1, wherein the at least one edge length of the Type II nanoprisms is about 100 nm to about 200 nm.

14. The process of claim 1, wherein the pH of the solution of silver nanoprisms is about 6 to about 7.9.

15. The process of claim 14, wherein the pH of the solution is about 7 to about 7.5.

* * * * *